United States Patent
Jang et al.

(10) Patent No.: US 6,444,518 B2
(45) Date of Patent: Sep. 3, 2002

(54) METHOD AND MANUFACTURING A DEVICE SEPARATION FILM IN A SEMICONDUCTOR DEVICE

(75) Inventors: Min Sik Jang; Young Jong Ki, both of Ichon (KR)

(73) Assignee: Hyundai Electronics Industries Co., Ltd., Hyungki-Do (KR)

( * ) Notice: Subject to any disclaimer, the term of this patent is extended or adjusted under 35 U.S.C. 154(b) by 0 days.

(21) Appl. No.: 09/880,358

(22) Filed: Jun. 13, 2001

(30) Foreign Application Priority Data

Jun. 30, 2000 (KR) .......................................... 2000-37037

(51) Int. Cl.$^7$ .......................................... H01L 21/8242
(52) U.S. Cl. .......................................... 438/245; 438/256
(58) Field of Search .................................. 438/149, 669, 438/425, 222, 708, 429, 712, 9, 218, 226, 245, 256

(56) References Cited

U.S. PATENT DOCUMENTS

| | | | | |
|---|---|---|---|---|
| 5,869,359 A | * | 2/1999 | Prahakar | 438/149 |
| 5,950,106 A | * | 9/1999 | May et al. | 438/669 |
| 5,994,200 A | * | 11/1999 | Kim | 438/425 |
| 6,020,230 A | * | 2/2000 | Wu | 438/222 |
| 6,124,211 A | * | 9/2000 | Butterbaugh et al. | 438/708 |
| 6,177,332 B1 | * | 1/2001 | Chen et al. | 438/429 |
| 6,303,512 B1 | * | 10/2001 | Laermer et al. | 438/712 |

\* cited by examiner

Primary Examiner—David Nelms
Assistant Examiner—Bau T Le
(74) Attorney, Agent, or Firm—Marshall, Gerstein & Borun.

(57) ABSTRACT

A method of manufacturing a device separation film in a semiconductor device is disclosed. In a process technology in which a trench is formed in a silicon substrate, silicon is grown at the bottom of the trench by SEG method in order to lower the aspect ratio and the trench is then filled with an insulating material so that voids are not generated. In order for silicon to be normally grown, a thermal oxide film formed at the bottom of the trench must be removed without removing the oxide film from the sides of the trench. The disclosed method reduces the speed of forming a thermal oxide film at the bottom of the trench, by plasma process using $CF_4$ and $O_2$ gas after forming the trench. Thereby facilitating the removal of the thermal oxide film at the bottom of the trench while minimizing loss of the thermal oxide film at the sidewall of the trench.

31 Claims, 4 Drawing Sheets

METHOD AND MANUFACTURING A DEVICE SEPARATION FILM IN A SEMICONDUCTOR DEVICE

BACKGROUND OF THE INVENTION

1. Field of the Invention

The invention relates generally to a method of manufacturing a device separation film in a semiconductor device. More particularly, the disclosed method relates to a method of manufacturing a device separation film in a semiconductor device by which a silicon growth layer is formed in order to reduce the aspect ratio of a trench, in a manner that the trench is filled so that voids are not generated.

2. Description of the Prior Art

In STI (shallow trench isolation) structures, device separation films are applied to devices below 0.10 μm. The most significant problem associated with such device separation films is gap fill. It is nearly impossible to provide a device separation film without voids using presently available gap fill materials.

Therefore, a modified STI structure using a SEG (selective epitaxial growth) structure has been introduced as a new type of a device separation film structure. In this structure, silicon is grown at the bottom of a trench by a SEG method in order to lower an otherwise high aspect ratio in a device below 0.01 μm. However, a thermal oxide film is formed in order to secure an interfacial characteristic between the silicon of the etched trench and a silicon growth layer or between the silicon of the trench and a gap fill material. In order to form silicon at the bottom of the trench by SEG method, however, the thermal oxide film at the bottom of the trench must be removed. The process of removing the thermal oxide film from the bottom of the trench must keep the oxide film at the side of the trench intact.

FIG. 1A is a TEM photograph showing a cross-sectional view of a device separation film manufactured by a conventional method and FIG. 1B is an enlarged view thereof. A trench is formed in a silicon substrate 1 and a thermal oxide film 5 is formed at the sidewall of the trench. At the bottom of the trench, some of the thermal oxide film 5a remains which prevents normal silicon growth, and, as a result, an abnormal silicon growth layer 6 is formed. Therefore, there is a need for a process where the thermal oxide film at the bottom of the trench is removed while leaving the thermal oxide film at the sides of the trench intact.

SUMMARY OF THE DISCLOSURE

The disclosed method teaches a method of manufacturing a device separation film in a semiconductor device capable of forming a device separation film without voids, by completely removing a thermal oxide film at the bottom of a trench while minimizing loss of the thermal oxide film at the sidewall of the trench, so that silicon can be normally grown to reduce the aspect ratio.

A method of manufacturing a device separation film in a semiconductor device is disclosed which is characterized in that it comprises the steps of providing a silicon substrate in which a trench is formed; performing a plasma process for the surface of the trench; forming a thermal oxide film in the trench; removing the thermal oxide film at the bottom of the trench; cleaning the silicon surface at the bottom of the trench and then forming a silicon growth layer by SEG process; and filling an insulating material into the trench and then performing a chemical mechanical polishing process.

In the above step, the plasma process employs fluorine-based such as $NF_3$, $CF_4$ etc. or chlorine-based such as $Cl_2$, $CCl_4$ etc. and $O_2$, which are mixed at the rate of 3:1 to 5:1.

The thermal oxide film is formed by dry oxidization process using $O_2$ or wet oxidization process using $H_2/O_2$ at a temperature ranging from about 700° C. to about 1100° C. The thermal oxide film is formed in thickness ranging from about 100 Å to about 140 Å. The thermal oxide film at the bottom of the trench is removed by dry etching or wet etching.

The silicon surface cleaning process is performed in two steps, wherein a first process is performed under the conditions of a temperature ranging from about 100° C. to about 130° C. and the ratio of $H_2SO_4$ and $H_2O_2$ ranging from about 3:1 to about 500:1 for a time period ranging from about 3 minutes to about 10 minutes, and a second process is performed under the conditions of a temperature ranging from about 50° C. to about 100° and a pure water or a ratio of $H_2O$ to HF ranging from about 50:1 to about 500:1. The silicon surface cleaning process employs a rapid thermal process (RTP), in case that it is performed in-situ when the SEG process is performed. The silicon surface cleaning process is, when the SEG process is performed in the UHV-CVD equipment, in-situ performed under vacuum atmosphere at a temperature ranging from about 700° C. to about 750° C. and at a pressure ranging from about 0.01 Torr to about 10 Torr for a time period ranging from about 10 seconds to about 200 seconds.

The SEG process is performed by CVD method using $MS/H_2/HCl$ gas or $DCS/H_2/HCl$ gas.

The SEG process is performed under the conditions of a temperature ranging from about 750° C. to about 850° C. and a pressure ranging from about 5 Torr to about 100 Torr, using a DCS flow rate ranging from about 0.1 sccm to about 1 sccm, a $H_2$ flow rate ranging from about 30 sccm to about 150 sccm and a HCl flow rate ranging from about 0 sccm to about 1 sccm. The SEG process is performed under the conditions of a temperature ranging from about 750° C. to about 850° C. and a pressure ranging from about 5 Torr to about 100 Torr, using a MS flow rate ranging from about 0.1 sccm to about 1 sccm, a $H_2$ flow rate ranging from about 30 sccm to about 150 sccm and a HCl flow rate ranging from about 0.5 sccm to about 5 sccm, when a MS-$H_2$—HCl system is applied. The SEG process, when it is performed in the UHV-CVD equipment, is performed under the conditions of a temperature ranging from about 600° C. to about 750° C. and a pressure ranging from about 1 Torr to about 50 m Torr using a $Si_2H_6$ flow rate ranging from about 1 sccm to about 20 sccm, a $H_2$ flow rate ranging from about 0 sccm to about 100 sccm and a HCl flow rate ranging from about 0.01 sccm to about 5 sccm.

BRIEF DESCRIPTION OF THE DRAWINGS

The aforementioned aspects and other features of the disclosed method will be explained in the following description, taken in conjunction with the accompanying drawings, wherein.

DETAILED DESCRIPTION OF THE PRESENTLY PREFERRED EMBODIMENTS

The disclosed method will be described in detail by way of a preferred embodiment with reference to accompanying drawings.

Figure 1A:
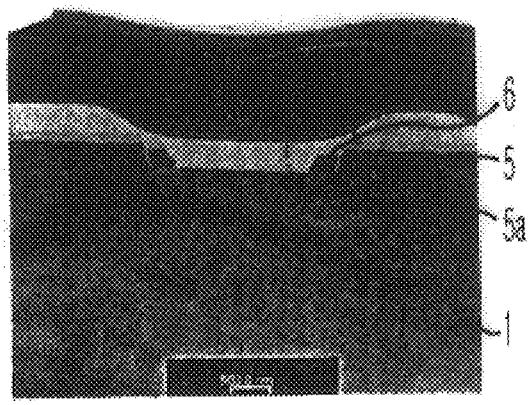
FIG. 1A is a TEM photograph showing a cross-sectional view of a device separation film manufactured by a conventional method.
Figure 1B:
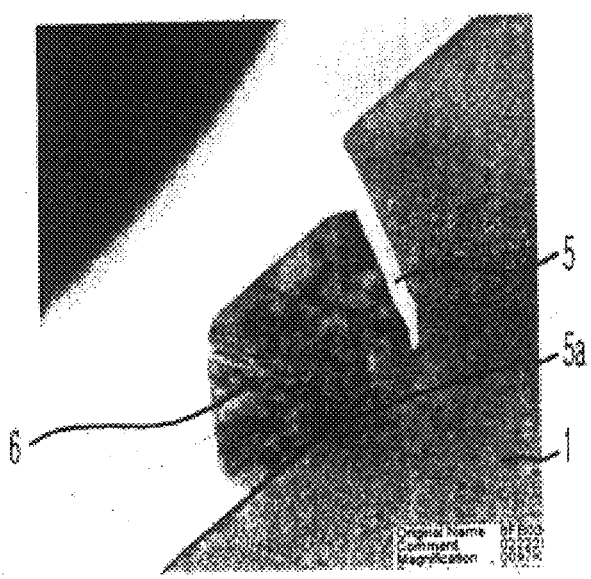
FIG. 1B is an enlarged partial view of the device separation film shown in FIG. 1A.
Figure 2A:
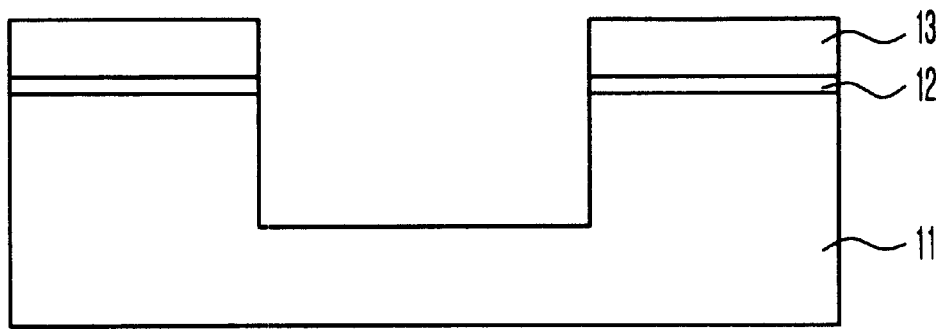
FIGS. 2A through 2F are cross-sectional views illustrating a disclosed method of manufacturing a device separation film in a semiconductor device.

FIGS. 2A through 2F are cross-sectional views for explaining a method of manufacturing a device separation film in a semiconductor device according to the disclosed method. Referring now to FIG. 2A, after a pad oxide film 12 and a nitride film 13 are sequentially formed on a silicon substrate 11, a portion of the nitride firm 13, the pad oxide film 12 and the silicon substrate 11, on which a device separation film will be formed, is etched by exposure etching process using a photoresist pattern, thus forming a trench.

Figure 2B:
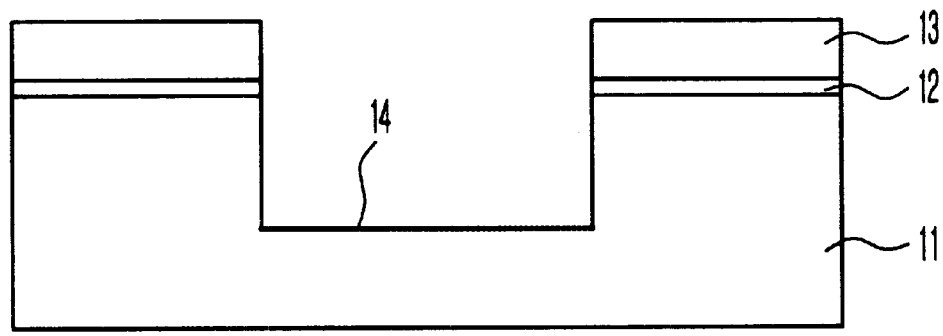

Referring now to FIG. 2B, the surface of the trench is exposed to plasma processing using a mixture gas containing fluorine (F) such as $CF_4$ etc. and $O_2$ gas. Due to this plasma process, fluorine is thinly distributed on the bottom 14 of the trench.

Gas used for the plasma process may employ fluorine-based such as $NF_3$, $CF_4$ etc. or chlorine-based such as $Cl_2$, $CCl_4$ etc. At this time, the mixed ratio of the gas and $O_2$ ranges from about 3:1 to about 5:1.

Figure 2C:
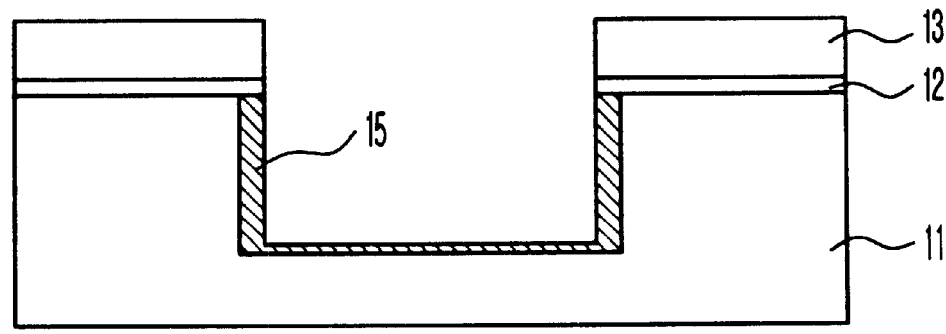

Referring now to FIG. 2C, the thermal oxide film 15 is formed in thickness ranging from about 100 Å to about 140 Å at the trench. The thermal oxide film 15 is formed on the trench by dry oxidization process using $O_2$ or wet oxidization process using $H_2/O_2$ at the temperature ranging from about 700° C. to about 1100° C.

The thermal oxide film 15 formed at the bottom of the trench is thinly formed since its deposition speed is slowed due to fluorine remained at the bottom 14 of the trench during the process shown in FIG. 2B. The thermal oxide film 15 is necessarily required in the STI structure as an oxide film, by maintaining an interfacial characteristic with the silicon growth layer grown from silicon at the side and bottom of the trench, and an insulating material to be filled into the trench, so that leakage current can be lowered.

Figure 2D:
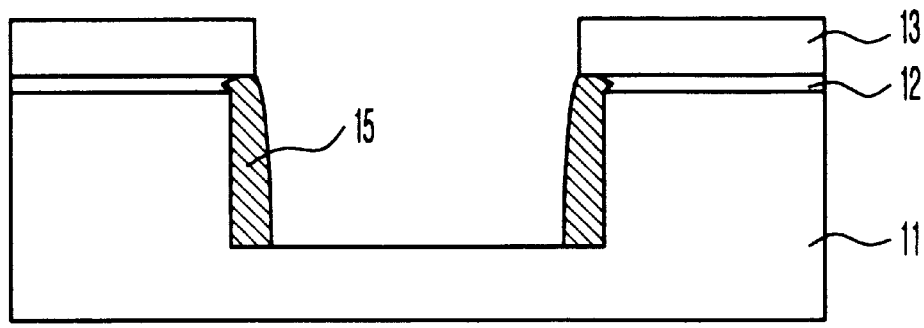

Referring now to FIG. 2D, the thermal oxide film at the bottom of the trench is removed by wet etch or dry etching process, thus remaining the thermal oxide film 15 only at the sidewall of the trench in a spacer shape. At this time, as loss of the thermal oxide film 15 at the sidewall of the trench must be minimized, the etch time must be a minimum time so that the thermal oxide film at the bottom of the trench can be completely removed.

Figure 2E:
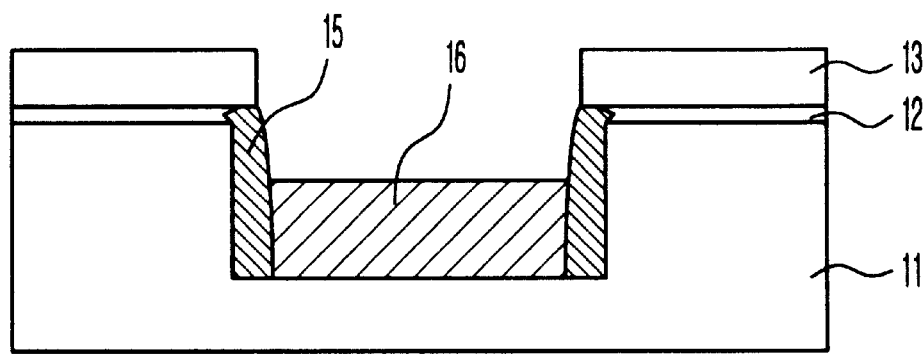

Referring now to FIG. 2E, silicon exposed at the bottom of the trench is grown by SEG method to form a silicon growth layer 16. At this time, the surface of silicon is cleaned before silicon is grown. The SEG method includes CVD method using MS or $DCS/H_2/HCl$ gas.

The silicon surface cleaning process before silicon is cleaned is performed in two steps, wherein a first process is performed under the conditions of a temperature ranging from about 100° C. to about 130° C. and the ratio of $H_2SO_4$ to $H_2O_2$ ranging from about 3:1 to about 500:1 for a time period ranging from about 3 minutes to about 10 minutes, and a second process is performed under the conditions of temperature ranging from about 50° C. to about 100° C. and a pure water or a ratio of $H_2O$ to HF ranging from about 50:1 to about 500:1.

When the SEG process is performed, the silicon surface cleaning process may be performed in-situ and employs a rapid thermal process (RTP). The SEG process is performed under the conditions of a temperature ranging from about 750° C. to about 850° C. and a pressure ranging from about 5 Torr to about 100 Torr using a DCS flow rate ranging from about 0.1 sccm to about 1 sccm, a $H_2$ flow rate ranging from about 30 sccm to about 150 sccm and a HCl flow rate ranging from about 0 sccm to about 1 sccm. When a $MS-H_2-HC_1$, system is applied, the SEG process is performed under the same temperature and pressure using a MS flow rate ranging from about 0.1 sccm to about 1 sccm, a $H_2$ flow rate ranging from about 30 sccm to about 150 sccm and a HCl flow rate ranging from about 0.5 sccm to about 5 sccm.

The in-situ silicon surface cleaning process, when the SEG process is performed in the UHV-CVD equipment, is performed under vacuum atmosphere under that conditions of a temperature ranging from about 700° C. to about 750° C. and a pressure ranging from about 0.01 Torr to about 10 Torr for a time period ranging from about 10 seconds to about 200 seconds. In this case, SEG process is performed under the conditions of a temperature ranging from about 600° C. to about 750° C. and a pressure ranging from about 1 Torr to about 50 m Torr, using a $Si_2H_6$ flow rate ranging from about 1 sccm to about 20 sccm, a $H_2$ flow rate ranging from about 30 sccm to about 150 sccm and a HCl flow rate ranging from about 0.05 sccm to about 5 sccm.

At this time, considering the well region of the device, the silicon growth layer 16 is formed below the well region. This is to prevent short of the well region and the device separation film region because the thickness of the thermal oxide film 15 formed at the sidewall of the trench is thin.

Figure 2F:
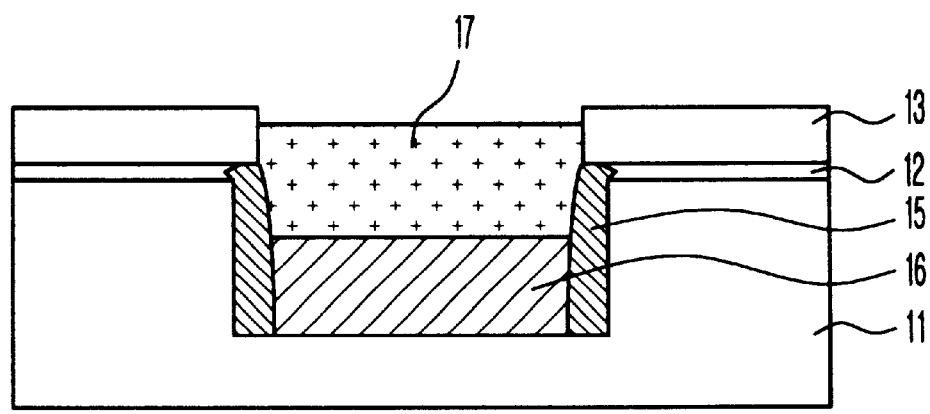

Referring now to FIG. 2F, an insulating material 17 is filled on the silicon growth layer 16 within the trench and is then flattened by chemical mechanical polishing process, thus forming a device separation film.

Figure 3A:
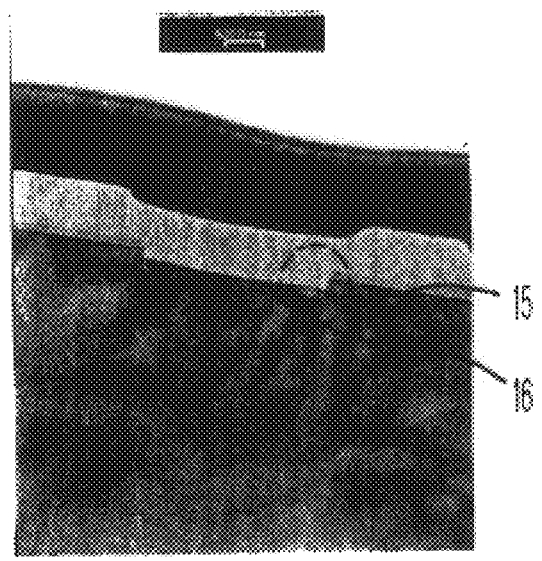
FIG. 3A is a TEM photograph showing a cross-sectional view of device separation film manufactured by the disclosed method.
Figure 3B:
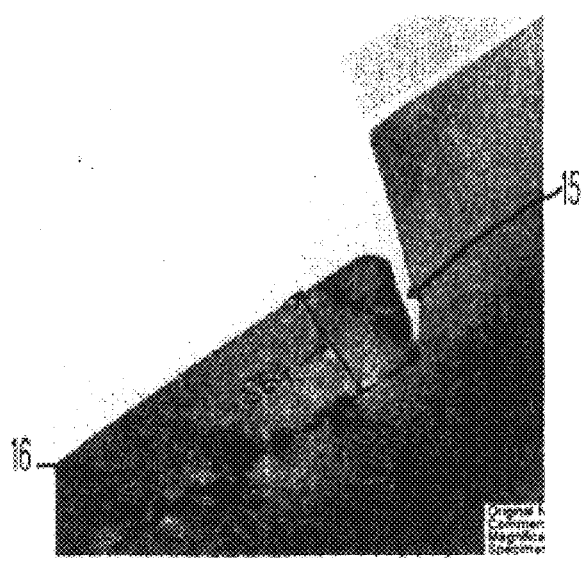
FIG. 3B is a partial enlarged view of the device separation film shown in FIG. 3A.

FIGS. 3A and 3B are TEM photographys showing a cross-sectional view of the device separation film formed according to the disclosed method.

It can be seen from FIG. 3B that the thermal oxide film 15 is formed at the sidewall of the trench in a spacer shape and the silicon growth layer 16 is normally formed, with the thermal oxide film 15 being completely removed at the bottom of the trench.

As mentioned above, according to the disclosed method, a thermal oxide film at the bottom of a trench is completely removed and a silicon growth layer having a normal shape is formed. Thus, it can improve an electrical characteristic of a device by fill an insulating material into the trench without voids.

The disclosed method has been described with reference to a particular embodiment in connection with a particular application. Those having ordinary skill in the art and access to the teachings of the disclosed method will recognize additional modifications and applications within the scope thereof.

It is therefore intended by the appended claims to cover any and all such applications, modifications, and embodiments within the scope of the disclosed method.

What is claimed:

1. A method of manufacturing a device separation film in a semiconductor device, comprising:

providing a silicon substrate in which a trench is formed, the trench comprising a surface comprising a bottom and a sidewall;

performing a plasma process on the surface of said trench;

forming a thermal oxide film on said surface of said trench;

removing said thermal oxide film from the bottom of said surface of said trench;

cleaning the bottom of said surface of said trench and then forming a silicon growth layer on said bottom by a SEG process; and filling an insulating material into said trench; and then performing a chemical mechanical polishing process.

2. The method of manufacturing a device separation film in a semiconductor device according to claim 1, wherein said plasma process employs a fluorine-based agent and $O_2$, which are mixed at a ratio ranging from about 3:1 to about 5:1.

3. The method of manufacturing a device separation film in a semiconductor device according to claim 1, wherein said plasma process employs a chlorine-based agent and $O_2$, which are mixed at a ratio ranging from about 3:1 to about 5:1.

4. The method of manufacturing a device separation film in a semiconductor device according to claim 1, wherein said thermal oxide film is formed by a dry oxidization process using $O_2$ wet oxidation process using $H_2/O_2$ at a temperature ranging from about 700° C. to about 1100° C.

5. The method of manufacturing a device separation film in a semiconductor device according to claim 1, wherein said thermal oxide film is formed by a wet oxidization process using $H_2/O_2$ at a temperature ranging from about 700° C. to about 1100° C.

6. The method of manufacturing a device separation film in a semiconductor device according to claim 1, wherein said thermal oxide film is formed in a thickness ranging from about 100 Å to about 140 Å.

7. The method of manufacturing a device separation film in a semiconductor device according to claim 1, wherein said thermal oxide film at the bottom of said trench is removed by dry etching or wet etching.

8. The method of manufacturing a device separation film in a semiconductor device according to claim 1, wherein said silicon surface cleaning process is performed in two steps, wherein a first step is performed under the conditions of a temperature ranging from about 100° C. to about 130° C. and a ratio of $H_2SO_4$ to $H_2O_2$ ranging from about 3:1 to about 500:1 for a time period ranging from about 3 minutes to about 10 minutes, and a second step is performed under conditions of a temperature ranging from about 50° C. to about 100° and either pure water or a ratio of $H_2O$ to HF ranging from about 50:1 to about 500:1.

9. The method of manufacturing a device separation film in a semiconductor device according to claim 1, wherein said silicon surface cleaning process employs a rapid thermal process (RTP) performed in-situ when the SEG process is performed.

10. The method of manufacturing a device separation film in a semiconductor device according to claim 1, wherein said SEG process is performed in the UHV-CVD equipment and said silicon surface cleaning process is in-situ performed under a vacuum atmosphere at a temperature ranging from about 700° C. to about 750° C. and a pressure ranging from about 0.01 Torr to about 10 Torr for a time period ranging from about 10 seconds to about 200 seconds.

11. The method of manufacturing a device separation film in a semiconductor device according to claim 1, wherein said SEG process is performed by a CVD method using one of $MS/H_2/HCl$ gas mixture or $DCS/H_2/HCl$ gas mixture.

12. The method of manufacturing a device separation film in a semiconductor device according to claim 1, wherein said SEG process is performed under the conditions of a temperature ranging from about 750° C. to about 850° C. and a pressure ranging from about 5 Torr to about 100 Torr, using a DCS flow rate ranging from about 0.1 sccm to about 1 sccm, a H2 flow rate ranging from about 30 sccm to about 150 sccm and a HCl flow rate ranging from about 0 sccm to about 1 sccm.

13. The method of manufacturing a device separation film in a semiconductor device according to claim 1, wherein said SEG process is performed under conditions of a temperature ranging from about 750° C. to about 850° C. and a pressure ranging from about 5 Torr to about 100 Torr, and using a MS flow rate ranging from about 0.1 sccm to about 1 sccm, a $H_2$ flow rate ranging from about 30 sccm to about 150 sccm and a HCl flow rate ranging from about 0.5 sccm to about 5 sccm, as a $MS$-$H_2$—HCl system is applied.

14. The method of manufacturing a device separation film in a semiconductor device according to claim 1, wherein said SEG process is performed in the UHV-CVD equipment and said SEG process is performed under conditions of a temperature ranging from about 600° C. to about 750° C. and a pressure ranging from about 1 Torr to about 50 m Torr and using a $Si_2H_6$ flow rate ranging from about 1 sccm to about 20 sccm, a $H_2$ flow rate ranging from about 0 sccm to about 100 sccm and a HCl flow rate ranging from about 0.01 sccm to about 5 sccm.

15. A semiconductor device made in accordance with the method of claim 1.

16. The method of claim 1, wherein the silicon surface cleaning process employs a rapid thermal process (RTP) performed in-situ when the SEG process is performed.

17. The method of claim 1, wherein the SEG process is performed in the UHV-CVD equipment and said SEG process is performed under conditions of a temperature ranging from about 600° C. to about 750° C. and a pressure ranging from about 1 Torr to about 50 m Torr and using a $Si_2H_6$ flow rate ranging from about 1 sccm to about 20 sccm, a $H_2$ flow rate ranging from about 0 sccm to about 100 sccm and a HCl flow rate ranging from about 0.01 sccm to about 5 sccm.

18. A method of manufacturing a device separation film in a semiconductor device, comprising:

providing a silicon substrate comprising a trench, the trench comprising a surface comprising a bottom and a sidewall;

depositing a thin layer of a halogen on the bottom of the trench by a plasma process;

forming a thermal oxide film on the surface of the trench;

removing the thermal oxide film from the bottom of the surface of the trench;

cleaning the bottom of the surface of the trench and then forming a silicon growth layer on the bottom by a SEG process; and filling an insulating material into the trench.

19. The method of claim 18 wherein the halogen is fluorine.

20. The method of claim 18, wherein the plasma process employs a fluorine-based agent and $O_2$, which are mixed at a ratio ranging from about 3:1 to about 5:1.

21. The method of claim 18, wherein the plasma process employs a chlorine-based agent and $O_2$, which are mixed at a ratio ranging from about 3:1 to about 5:1.

22. The method of claim 18, wherein the thermal oxide film is formed by a dry oxidization process using $O_2$ wet oxidation process using $H_2/O_2$ at a temperature ranging from about 700° C. to about 1100° C.

23. The method of claim 18, wherein the thermal oxide film is formed by a wet oxidization process using $H_2/O_2$ at a temperature ranging from about 700° C. to about 1100° C.

24. The method of claim 18, wherein the silicon surface cleaning process is performed in two steps, wherein a first step is performed under the conditions of a temperature ranging from about 100° C. to about 130° C. and a ratio of $H_2SO_4$ to $H_2O_2$ ranging from about 3:1 to about 500:1 for a time period ranging from about 3 minutes to about 10 minutes, and a second step is performed under conditions of a temperature ranging from about 50° C. to about 100° and either pure water or a ratio of $H_2O$ to HF ranging from about 50:1 to about 500:1.

25. The method of claim 18, wherein the SEG process is performed in the UHV-CVD equipment and said silicon surface cleaning process is in-situ performed under a vacuum atmosphere at a temperature ranging from about 700° C. to about 750° C. and a pressure ranging from about 0.01 Torr to about 10 Torr for a time period ranging from about 10 seconds to about 200 seconds.

26. The method of claim 16, wherein the SEG process is performed by a CVD method using one of $MS/H_2/HCl$ gas mixture or $DCS/H_2/HCl$ gas mixture.

27. The method claim 18, wherein the SEG process is performed under the conditions of a temperature ranging from about 750° C. to about 850° C. and a pressure ranging from about 5 Torr to about 100 Torr, using a DCS flow rate ranging from about 0.1 sccm to about 1 sccm, a H2 flow rate ranging from about 30 sccm to about 150 sccm and a HCl flow rate ranging from about 0 sccm to about 1 sccm.

28. The method of claim 18, wherein the SEG process is performed under conditions of a temperature ranging from about 750° C. to about 850° C. and a pressure ranging from about 5 Torr to about 100 Torr, and using a MS flow rate ranging from about 0.1 sccm to about 1 sccm, a $H_2$ flow rate ranging from about 30 sccm to about 150 sccm and a HCl flow rate ranging from about 0.5 sccm to about 5 sccm, as a $MS-H_2$—HCl system is applied.

29. The method of claim 18 further comprising planarizing the insulating material.

30. The method of claim 29 wherein the planarizing is performed by a chemical mechanical polishing process.

31. A semiconductor device made in accordance with the method of claim 18.

* * * * *